(12) United States Patent
Chopra et al.

(10) Patent No.: US 7,960,236 B2
(45) Date of Patent: Jun. 14, 2011

(54) PHOSPHORUS CONTAINING SI EPITAXIAL LAYERS IN N-TYPE SOURCE/DRAIN JUNCTIONS

(75) Inventors: Saurabh Chopra, Sunnyvale, CA (US);
Zhiyuan Ye, Cupertino, CA (US);
Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 538 days.

(21) Appl. No.: 11/957,820

(22) Filed: Dec. 17, 2007

(65) Prior Publication Data

US 2008/0182075 A1 Jul. 31, 2008

Related U.S. Application Data

(63) Continuation-in-part of application No. 11/609,826, filed on Dec. 12, 2006.

(51) Int. Cl.
*H01L 21/336* (2006.01)
(52) U.S. Cl. .................. 438/300; 438/607; 257/E21.461
(58) Field of Classification Search .................. 438/199, 438/299–300, 508, 607; 257/E21.461
See application file for complete search history.

(56) References Cited

U.S. PATENT DOCUMENTS

| | | | |
|---|---|---|---|
| 5,108,792 A | 4/1992 | Anderson et al. | |
| 5,179,677 A | 1/1993 | Anderson et al. | |
| 5,186,718 A | 2/1993 | Tepman et al. | |
| 6,803,297 B2 | 10/2004 | Jennings et al. | |
| 6,821,825 B2 | 11/2004 | Todd et al. | |
| 6,897,131 B2 | 5/2005 | Ramachandran et al. | |
| 6,916,398 B2 | 7/2005 | Chen et al. | |
| 6,998,153 B2 | 2/2006 | Chiang et al. | |
| 7,132,338 B2 | 11/2006 | Samoilov et al. | |
| 7,166,528 B2 | 1/2007 | Kim et al. | |
| 7,312,128 B2 | 12/2007 | Kim et al. | |
| 7,521,365 B2 | 4/2009 | Kim et al. | |
| 7,560,352 B2 | 7/2009 | Carlson et al. | |
| 7,572,715 B2 | 8/2009 | Kim et al. | |
| 2004/0043149 A1 | 3/2004 | Gordon et al. | |
| 2004/0171238 A1 | 9/2004 | Arena et al. | |
| 2004/0224089 A1 | 11/2004 | Singh et al. | |

(Continued)

FOREIGN PATENT DOCUMENTS

| | | |
|---|---|---|
| KR | 10-2003-0002646 | 1/2003 |
| KR | 10-2004-0003881 | 1/2004 |
| KR | 10-2007-0006852 | 1/2007 |

OTHER PUBLICATIONS

"Search Report mailed Mar. 23, 2009 for International Application No. PCT/US2008/086919 filed Dec. 16, 2008", 7 pgs.

(Continued)

*Primary Examiner* — Thanhha Pham
(74) *Attorney, Agent, or Firm* — Diehl Servilla LLC

(57) ABSTRACT

Methods for formation of epitaxial layers containing n-doped silicon are disclosed. Specific embodiments pertain to the formation and treatment of epitaxial layers in semiconductor devices, for example, Metal Oxide Semiconductor Field Effect Transistor (MOSFET) devices. In specific embodiments, the formation of the n-doped epitaxial layer involves exposing a substrate in a process chamber to deposition gases including a silicon source, a carbon source and an n-dopant source. An epitaxial layer may have considerable tensile stress which may be created in a significant amount by a high concentration of n-dopant. A layer having n-dopant may also have substitutional carbon. Phosphorus as an n-dopant with a high concentration is provided. A substrate having an epitaxial layer with a high level of n-dopant is also disclosed.

13 Claims, 5 Drawing Sheets

U.S. PATENT DOCUMENTS

| | | |
|---|---|---|
| 2005/0054171 A1 | 3/2005 | Chu et al. |
| 2005/0079691 A1 | 4/2005 | Kim et al. |
| 2005/0079692 A1 | 4/2005 | Samoilov et al. |
| 2005/0241671 A1 | 11/2005 | Dong et al. |
| 2006/0051958 A1 | 3/2006 | Ho |
| 2006/0115933 A1 | 6/2006 | Ye et al. |
| 2006/0115934 A1 | 6/2006 | Kim et al. |
| 2006/0148151 A1 | 7/2006 | Murthy et al. |
| 2006/0216876 A1 | 9/2006 | Kim et al. |
| 2006/0234488 A1 | 10/2006 | Kim et al. |
| 2006/0234504 A1 | 10/2006 | Bauer et al. |
| 2006/0240630 A1 | 10/2006 | Bauer et al. |
| 2006/0260538 A1 | 11/2006 | Ye et al. |
| 2007/0207596 A1 | 9/2007 | Kim et al. |
| 2008/0237608 A1 | 10/2008 | Richieri |
| 2008/0251851 A1 | 10/2008 | Pan et al. |
| 2008/0283926 A1 | 11/2008 | Sridhar |

OTHER PUBLICATIONS

"Written Opinion mailed Mar. 23, 2009 for International Application No. PCT/US2008/086919 filed Dec. 16, 2008", 4 pgs.

"Final Office Action mailed Apr. 7, 2010", U.S. Appl. No. 11/609,826, 14 pgs.

"PCT/US 07/86984—Search Report—Apr. 16, 2008".

"PCT/US 07/86984—Written Opinion—Apr. 16, 2008".

"Non-Final Office Action for U.S. Appl. No. 11/609,826", (Jul. 24, 2008),10 pgs.

"Non-Final Office Action mailed Aug. 11, 2009 in U.S. Appl. No. 11/609,826, filed Dec. 12, 2006", 6 pgs.

Non-Final Office Action in U.S. Appl. No. 11/609,826 (Nov. 27, 2009), 26 pgs.

Bauer, M., "Tensile Strained Selective Silicon Carbon Alloys for Recessed Source Drain Areas of Devices", *Abstract 210th ECS Meeting*Oct. 29 *through* Nov. 3, 2006.

PHOSPHORUS CONTAINING SI EPITAXIAL LAYERS IN N-TYPE SOURCE/DRAIN JUNCTIONS

RELATED APPLICATION

This application is a continuation-in-part of U.S. application Ser. No. 11/609,826 filed Dec. 12, 2006, which is incorporated herein by reference in its entirety.

BACKGROUND

Embodiments of the present invention generally relate to methods and apparatus for selective formation of epitaxial layers containing silicon, carbon and a doping material. Specific embodiments pertain to methods and apparatus for the selective formation of n-doped epitaxial layers in semiconductor devices, for example, Metal Oxide Semiconductor Field Effect Transistor (MOSFET) devices.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers, which may be complementary to the compressively strained SiGe channel in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

It is desirable for the carbon-doped silicon epitaxial layer to contain substitutional C atoms to induce tensile strain in the channel. Higher channel tensile strain can be achieved with increased substitutional C content in a carbon-doped silicon source and drain.

Generally, sub-100 nm CMOS (complementary metal-oxide semiconductor) devices require a junction depth to be less than 30 nm. Selective epitaxial deposition is often utilized to form epitaxial layers ("epilayers") of silicon-containing materials (e.g., Si, SiGe and Si:C) into the junctions.

Si:C in the source/drain junction regions has been shown to enhance nFET device performance by inducing tensile stress due to its small atomic size compared to Silicon. In order to reduce series resistance, these junctions also need to be heavily n-doped. For example, phosphorus or arsenic can be used for n-doping. If the Si:C is epitaxially grown in the recessed junction areas, both the concentration of substitutional carbon (Csub) as well as substitutional phosphorus (Psub) need to be as high as possible for high tensile stress as well as for low series resistance. However, Csub is not stable under excessive amounts of thermal stress as the Si:C film is grown under metastable conditions. For instance, most of the stress is lost after a 1050° C. thermal spike anneal. The challenge is to retain the tensile stress in the channel after multiple anneals while keeping the series resistance as low as possible.

Current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface. In addition, most of the C atoms incorporated through typical selective Si:C epitaxy processes at the higher process temperatures occupy non-substitutional (i.e. interstitial) sites of the Si lattice. By lowering growth temperature below about 600° C., a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures.

The manufacturing conditions for silicon carbon epitaxy may be different for epitaxy having different dopants and dopant concentrations. The incorporation of high levels of dopants (e.g. greater than $10^{20}$ atoms/cm$^3$) into the Si:C epitaxy during deposition is of interest, because the incorporation of high levels of dopants during deposition reduces the need to increase the dopant level using subsequent procedures such as ion implantation. Also, despite the benefits of Csub, the processing involved in incorporating Csub into the source/drain region may pose significant challenges. Thus, the incorporation of high levels of dopants into the Si:C epitaxy, and eliminating carbon completely in favor of a dopant for creating tensile stress may have beneficial effects on the performance of a device while alleviating significant challenges in the epitaxial processing.

Accordingly, improved and novel methods are required for providing tensile stress in the channel and providing low series resistance while depending less on the presence of substitutional carbon.

SUMMARY OF THE INVENTION

One embodiment of the present invention relates to methods of forming and processing epitaxial layers containing silicon. Other embodiments relate to methods manufacturing of fabricating transistor devices including epitaxial layers containing silicon and n-dopants such as phosphorus and carbon.

In accordance with an aspect of the present invention a method is provided for epitaxially forming a silicon film on a substrate surface, comprising placing a substrate including a monocrystalline surface and secondary surfaces into a process chamber, exposing the substrate to a deposition gas comprising a mix of a silicon source, a carrier gas and an n-type dopant source at a temperature of below about 600° C., and creating an epitaxial silicon layer with n-dopant with a level equal to or greater than about $7 \times 10^{20}$ atoms cm$^{-3}$.

In accordance with one embodiment of the present invention the pressure in the process chamber is maintained at about 10 Torr. In one or more embodiments, the n-dopant is phosphorus, and the n-type dopant source comprises phosphine.

In accordance with one or more embodiments, the silicon source is a higher order silane. According to one or more embodiments of the present invention, the silicon source is selected from the group consisting of trisilane and pentasilane. In certain embodiments, the level of the n-dopant is at least about $8 \times 10^{20}$ atoms/cm$^3$. In specific embodiments, the level of the n-dopant is about $1.2 \times 10^{21}$ atoms/cm$^3$.

According to one or more embodiments, the temperature during deposition is in a range of about 540° C. and below about 560° C. In accordance with another embodiment, the n-dopant is a capping layer on top of a silicon carbon layer. In one or more embodiments, the epitaxial layer has a tensile stress created by n-dopants in the layer that is equivalent to the tensile stress that can be created by a concentration of substitutional carbon in the epitaxial layer of about 0.55%. In specific embodiments, a measured resistivity in the epitaxial layer is greater than about 0.25 mOhm·cm. and lower than 0.5 mOhm·cm.

In accordance with a further aspect of the present invention a method is provided, wherein the epitaxial film is formed during a fabrication step of a transistor manufacturing process, and the method further comprises forming a gate dielectric on a substrate, forming a gate electrode on the gate dielectric, and forming source/drain regions on the substrate on opposite sides of the electrode and defining a channel region between the source/drain regions. In one embodiment, the epitaxial silicon layer with the n-dopant is a layer formed on recessed source/drain areas. In one or more embodiments, the epitaxial silicon layer with the n-dopant is a capping layer on top of a silicon carbon layer formed on recessed source/drain areas.

In accordance with another aspect of the present invention a silicon film on a substrate surface is provided, comprising an epitaxially formed silicon layer, the layer including an n-dopant with a concentration being not less than about $7 \times 10^{20}$ atoms/cm$^3$. In one embodiment, the n-dopant is phosphorus. In specific embodiments, the concentration of phosphorus is about $1 \times 10^{21}$ atoms/cm$^3$. In another specific embodiment, a silicon film on a substrate surface is provided, wherein a measured resistivity is greater than about 0.25 mOhm·cm. and lower than 0.5 mOhm·cm. In certain embodiments, the layer also includes substitutional carbon.

In accordance with a further aspect of the present invention a silicon film on a substrate surface is provided, wherein the epitaxially formed silicon layer has a tensile stress created by n-dopants in the layer that is equivalent to the tensile stress that can be created by a concentration of substitutional carbon in the epitaxially formed silicon layer of about 0.55%. In one embodiment, the epitaxially formed silicon layer with n-dopant is a layer formed on recessed source/drain areas. In specific embodiments, the epitaxially formed silicon layer with n-dopant is a capping layer on top of a silicon carbon layer formed on recessed source/drain areas.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
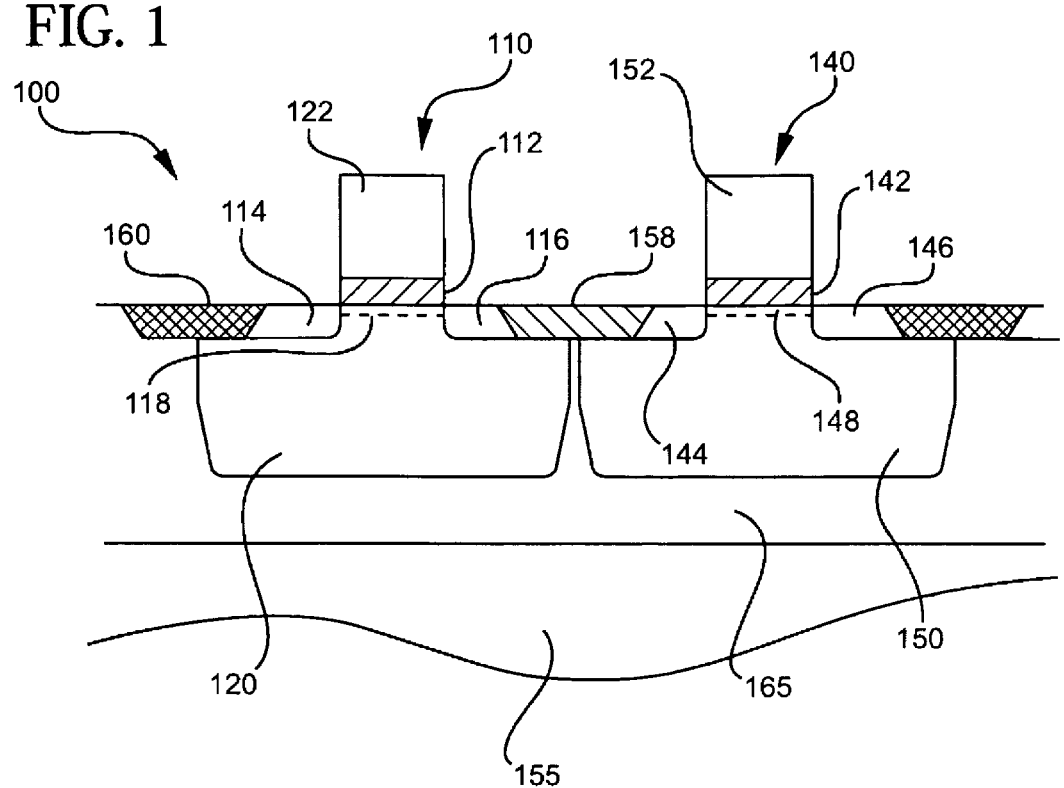
FIG. 1 is a cross-sectional view of a field effect transistor pair in accordance with an embodiment of the invention.

Embodiments of the invention generally provide methods and apparatus for forming and treating a silicon-containing epitaxial layer. Specific embodiments pertain to methods and apparatus for forming and treating an epitaxial layer during the manufacture of a transistor.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

Throughout the application, the terms "silicon-containing" materials, compounds, films or layers should be construed to include a composition containing at least silicon and may contain germanium, carbon, boron, arsenic, phosphorus gallium and/or aluminum. Compounds or alloys of silicon-containing materials may be represented by an abbreviation, such as Si for silicon, SiGe for silicon germanium, Si:C for silicon carbon and SiGeC for silicon germanium carbon. Other compounds are SiP for silicon phosphorus and SiCP for silicon carbon phosphorus. The abbreviations do not represent chemical equations with stoichiometrical relationships, nor represent any particular reduction/oxidation state of the silicon-containing materials.

One or more embodiments of the invention generally provide processes to selectively and epitaxially deposit silicon-containing materials on monocrystalline surfaces of a substrate during fabrication of electronic devices. A substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. The epitaxial process typically includes repeating a cycle of a deposition process and an etching process until the desired thickness of an epitaxial layer is grown. Exemplary alternating deposition and etch processes are disclosed in commonly assigned and copending U.S. patent application Ser. No. 11/001,774, published as United States Patent Application Publication No. 2006/0115934, entitled, Selective Epitaxy Process With Alternating Gas Supply, the entire content of which is incorporated herein by reference.

In one or more embodiments, the deposition process includes exposing the substrate surface to a deposition gas containing at least a silicon source and a carrier gas. The deposition gas may also include a germanium source and/or carbon source, as well as a dopant source. In one embodiment the deposition gas contains a silicon source, a carrier gas, and a dopant source, but no carbon source. In particular embodiments, the deposition gas contains a sufficient amount of an n-type dopant precursor that results in the epitaxial film containing at least about $7 \times 10^{20}$ atoms/cm$^3$ of an n-type dopant. In specific embodiments, the final epitaxial film contains at least about $7.\times 10^{20}$ to $1 \times 10^{21}$ atoms/cm$^3$ of an n-type dopant, and more specifically, at least about $1 \times 10^{21}$ atoms/cm$^3$ of an n-type dopant. As used herein, these levels of dopant concentration will be referred to as heavily doped with an n-type dopant. An example of a suitable n-type dopant includes phosphorus. During the deposition process, an epitaxial layer is formed on the monocrystalline surface of the substrate, while a polycrystalline/amorphous layer is formed on secondary surfaces, such as dielectric, amorphous and/or polycrystalline surfaces, which will be collectively referred to as "secondary surfaces". Subsequently, the substrate is exposed to an etching gas. Typically, the etching gas includes a carrier gas and an etchant, such as chlorine gas or hydrogen chloride. However, according to one or more embodiments, applicants determined that effective etching of heavily doped n-type films can be etched only with hydrogen chloride, and not with chlorine gas. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and variants thereof, including dopants.

Nitrogen is a possible carrier gas due to cost considerations associated with the use of argon and helium as a carrier gas. Despite the fact that nitrogen is generally less expensive than argon, according to one or more embodiments of the invention, hydrogen may be used instead as a carrier gas, particularly in embodiments in which high concentrations of n-dopant are desired. The use of hydrogen has as an advantage the elimination of oxygen and its side effects during deposition According to a first embodiment of the invention, blanket or nonselective epitaxy with alternating steps of deposition and purge results in improved crystallinity of epitaxial films grown using a higher order silane compared to continuous deposition. In a further embodiment continuous deposition may be used for creating epitaxial layers. As used herein, "higher order silane" refers to a disilane or higher silane precursor. In certain specific embodiments, "higher order silane" refers to disilane, neopentasilane (NPS), or a mixture of these. In one embodiment in accordance with an aspect of the present invention the silicon source gas is a "higher order silane". In one embodiment higher order silicon precursors are used from a group of silicon precursors which include trisilane, and pentasilane. In a specific embodiment, trisilane or pentasilane are used as silicon precursor gas.

An exemplary process includes loading a substrate into a process chamber and adjusting the conditions within the process chamber to a desired temperature and pressure. Then, a deposition process is initiated to form an epitaxial layer on a monocrystalline surface of the substrate. The deposition process is then terminated. The thickness of the epitaxial layer is then determined. If the predetermined thickness of the epitaxial layer is achieved, then the epitaxial process is terminated. However, if the predetermined thickness is not achieved, then steps of deposition and purge are repeated as a cycle until the predetermined thickness is achieved. Further details of this exemplary process are described below.

The substrates may be unpatterned or patterned. Patterned substrates are substrates that include electronic features formed into or onto the substrate surface. The patterned substrate usually contains monocrystalline surfaces and at least one secondary surface that is non-monocrystalline, such as a dielectric, polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

After loading a substrate into the process chamber, the conditions in the process chamber are adjusted to a predetermined temperature and pressure. The temperature is tailored to the particular conducted process. Generally, the process chamber is maintained at a temperature below about 600° C. during deposition and above about 600° C. during etching. The appropriate temperature to conduct epitaxial process may depend on the particular precursors used to deposit the silicon-containing. In one embodiment, the temperature during deposition is maintained at a range of below 580° C. and above 500° C. In a further embodiment, the temperature during deposition is maintained at about 550° C.

The process chamber is usually maintained at a pressure from about 0.1 Torr to 50 Torr during deposition. In one embodiment, the deposition pressure is maintained at about 10 Torr. The pressure may fluctuate during and between process steps, but is generally maintained constant. During etching, the pressure in the chamber is ramped up to at least about 10 times the pressure used during deposition.

During the deposition process the substrate is exposed to a deposition gas to form an epitaxial layer. The substrate is exposed to the deposition gas for a period of time of about 0.5 seconds to about 30 seconds, for example, from about 1 second to about 20 seconds, and more specifically from about 5 seconds to about 10 seconds. In a specific embodiment, the deposition step lasts for about 10 to 11 seconds. In a further specific embodiment using a deposition and purge approach the deposition time is about 40 seconds. In another embodiment using continuous deposition the time of deposition is determined by the growth rate and thickness of the layer. The specific exposure time of the deposition process is determined in relation to the exposure time during a subsequent etching process, as well as particular precursors and temperature used in the process. Generally, the substrate is exposed to the deposition gas long enough to form a maximized thickness of an epitaxial layer In one or more embodiments, the deposition gas contains at least a silicon source and a carrier gas, and may contain at least one secondary elemental source, such as a carbon source. Also, the deposition gas may further include a dopant compound to provide a source of a dopant, such as boron, arsenic, phosphorus, gallium and/or aluminum. In one embodiment the deposition gas includes a phosphorus source. In a further embodiment the phosphorus source gas is phosphine ($PH_3$).

The silicon source is usually provided into the process chamber at a rate in a range from about 5 sccm to about 500 sccm, specifically from about 10 sccm to about 300 sccm, and more specifically from about 50 sccm to about 200 sccm, for example, about 135 sccm. In a specific embodiment, a higher silane is flowed at about 135 sccm. Organosilanes include compounds with the empirical formula $R_y Si_x H_{(2x+2-y)}$, where R=methyl, ethyl, propyl or butyl, such as methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$) and hexamethyldisilane ($(CH_3)_6Si_2$). Organosilane compounds have been found to be advantageous silicon sources as well as carbon sources in embodiments which incorporate carbon in the deposited silicon-containing compound. According to one or more embodiments, trisilane or pentasilane in an hydrogen-containing carrier gas is a suitable silicon-containing source and carrier gas combination.

The silicon source is usually provided into the process chamber along with a carrier gas. The carrier gas has a flow rate from about 1 slm (standard liters per minute) to about 100 slm. Carrier gases may include nitrogen ($N_2$), hydrogen ($H_2$), argon, helium and combinations thereof. Hydrogen carrier gas at a flow rate of about in the range of about 3 slm to 8 slm, for example about 4 slm, works well in a particular embodiment of the invention.

The deposition gas used also contains in accordance with an aspect of the present invention at least one secondary elemental source, such as a dopant source and/or a carbon source. A carbon source may be added during deposition to the process chamber with the silicon source and carrier gas to form a silicon-containing compound, such as a silicon carbon material. A carbon source is usually provided into the process chamber at a rate in the range from about 0.1 sccm to about 20 sccm, for example, from about 0.5 sccm to about 10 sccm, and more specifically, from about 1 sccm to about 5 sccm, for example, about 2 sccm. The carbon source may be diluted in hydrogen gas and flowed at a rate of 300 sccm. Carbon sources useful to deposit silicon-containing compounds include organosilanes, alkyls, alkenes and alkynes of ethyl, propyl and butyl. Such carbon sources include methylsilane ($C_{H3}Si_{H3}$), dimethylsilane ($(C_{H3})_2Si_{H2}$), ethylsilane ($C_{H3}C_{H2}Si_{H3}$), methane ($C_{H4}$), ethylene ($_{C2}H4$), ethyne ($_{C2H2}$), propane ($_{C3H8}$), propene ($_{C3H6}$), butyne ($_{C4H6}$), as well as others. The carbon concentration of an epitaxial layer is in the range from about 200 ppm to about 5 atomic %, particularly from about 1 atomic % to about 3 atomic %, for example 1.5 atomic %. In one embodiment, the carbon concentration of an epitaxial layer is less than 0.6%, with a co-existing concentration of P dopant of greater than $7 \times 10^{20}$ atoms $c^{m-3}$. In a further embodiment the concentration of carbon is 0% or about 0% and the concentration of an n-dopant is $1 \times 10^{21}$ atoms $c^{m-3}$. In one embodiment the carbon source is a gas which is selected from methyl silane, dimethyl silane and trimethyl silane.

The deposition gas used during deposition may further include at least one dopant compound to provide a source of elemental dopant, such as boron, arsenic, phosphorus, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. As an aspect of the present invention the level of n-dopant such as phosphorus in an epitaxial layer is increased significantly over commonly achieved concentrations in order to create significant tensile stress. In one example, the silicon-containing compound is doped n-type with phosphorus to a concentration in the range from about $5 \times 10^{20}$ atoms/cm$^3$ to about $1 \times 10^{21}$ atoms/cm$^3$. In specific embodiments, the dopant level exceeds about $8 \times 10^{20}$ atoms/cm$^3$.

A dopant source is usually provided into the process chamber during deposition. Dopants may include arsine ($AsH_3$), phosphine ($PH_3$) and alkylphosphines, such as with the empirical formula $R_x PH_{(3-x)}$, where R=methyl, ethyl, propyl or butyl and x=1, 2 or 3. Alkylphosphines include trimethylphosphine ($(CH_{33}P)$), dimethylphosphine ($(CH_3)_2PH$), triethylphosphine ($(CH_3CH_{23}P)$ and diethylphosphine ($(CH_3CH_2)_2PH$). In a specific embodiment a phosphorus source gas is used, which may be phosphine. In one embodiment the flow of a phosphine gas is in a range of 2 to 20 sccm. In a further embodiment the phosphine gas is provided in a rate of 10 sccm. In yet another embodiment a silicon precursor gas from a higher silane with a flow of 135 sccm and phosphine as a phosphorus source with a flow of 10 sccm is used.

According to one or more embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants. In an exemplary embodiment, the process chamber may be purged for about 10 seconds by flowing a carrier gas at about 5 slm. A cycle of deposition and purge may be repeated for numerous cycles. In one embodiment, the deposition and purge cycle is repeated about 30 times. In another embodiment a continuous deposition process may be used.

In another aspect of the present invention, a blanket or non-selective deposition is performed at low temperatures, for example, below about 600° C. and lower, using a higher order silane (e.g. disilane and higher) source. This assists in amorphous growth (rather than polycrystalline) on dielectric surfaces such as oxide and nitride during the deposition step (nonselective deposition), which facilitates removal of the layer on dielectric surfaces by a subsequent etch step and minimizes damage on single crystalline layer grown on the crystalline substrate.

Figure 3:
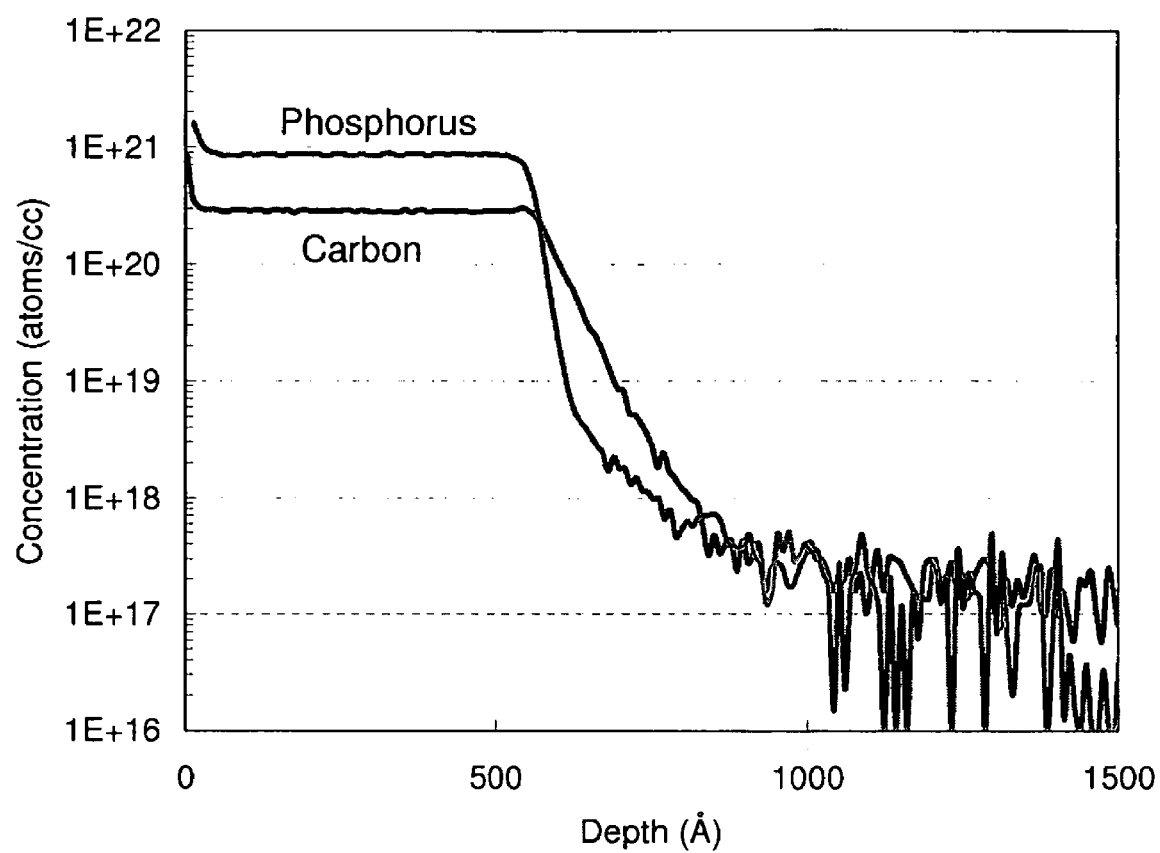
FIG. 3 is a graph showing a SIMS profile in accordance with an embodiment of the present invention.
Figure 4:
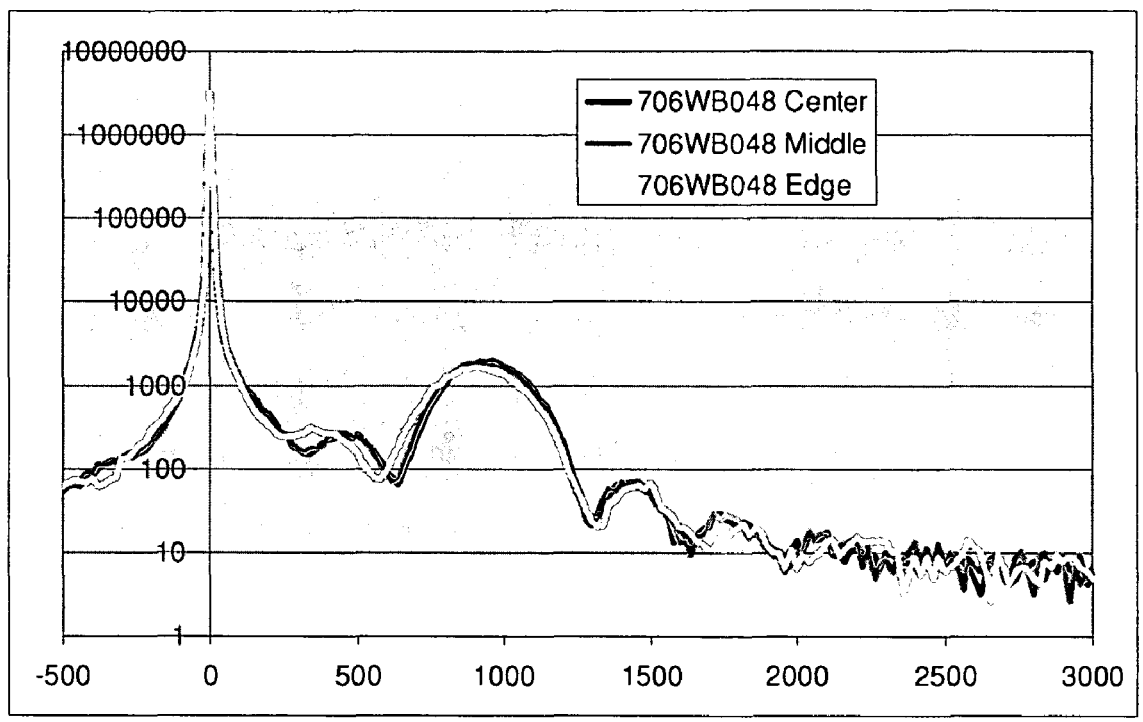
FIG. 4 is a graph showing XRD spectra in accordance with an embodiment of the present invention.
Figure 6:
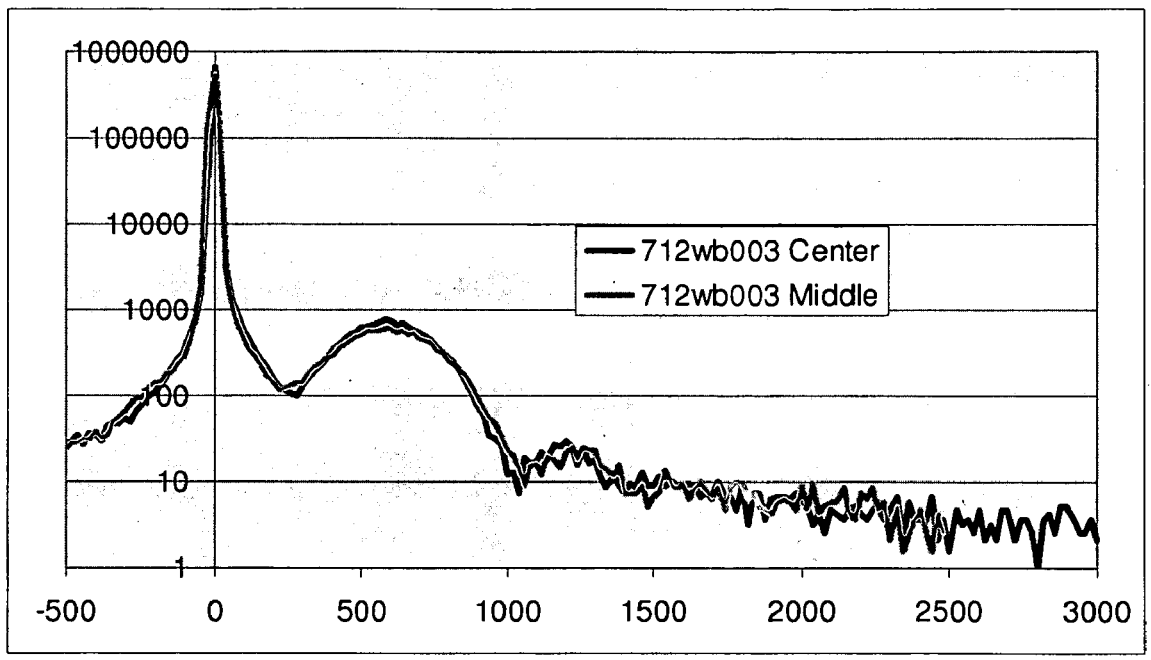
FIG. 6 is a graph showing XRD spectra in accordance with another embodiment of the present invention.

Thus, embodiments of the present invention provide selective epitaxy processes for silicon-containing films, for example, Si:C films with lower substitutional carbon concentration (<1%), but with higher concentration of n-dopants up to $1 \times 10^{21}$ cm$^{-3}$ which can be used for forming tensile strained channel of N-type MOSFET structure when epitaxial films are grown on recessed source/drain of a transistor. In general, it is difficult to achieve both of low but still significant substitutional carbon concentration for instance 0.5% in Si:C epitaxy and very high concentrations of n-dopant such as phosphorus at greater than $7 \times 10^{21}$ cm$^{-3}$. According to one or more embodiments of the invention, both are achieved. In a further embodiment an epitaxial layer is achieved with a concentration of n-dopant such as phosphorus that achieves the same amount of tensile stress in the layer as up to 0.3% carbon. FIGS. 3 and 4 show that an epitaxial layer is created to result in the same amount of tensile strain that an epitaxial layer with 0.85% substitutional carbon concentration has, but wherein 0.3% substitutional carbon is replaced by a high concentration of n-dopant. FIG. 6 has a graph of XRD data from films with no carbon and all phosphorus, which shows ~700 arc second peak shift. This is equivalent to strain induced by 0.55% substitutional carbon.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 2 and described immediately above are exemplary only, and various variants in materials, layers, etc. are within the scope of the present invention.

Figure 2:
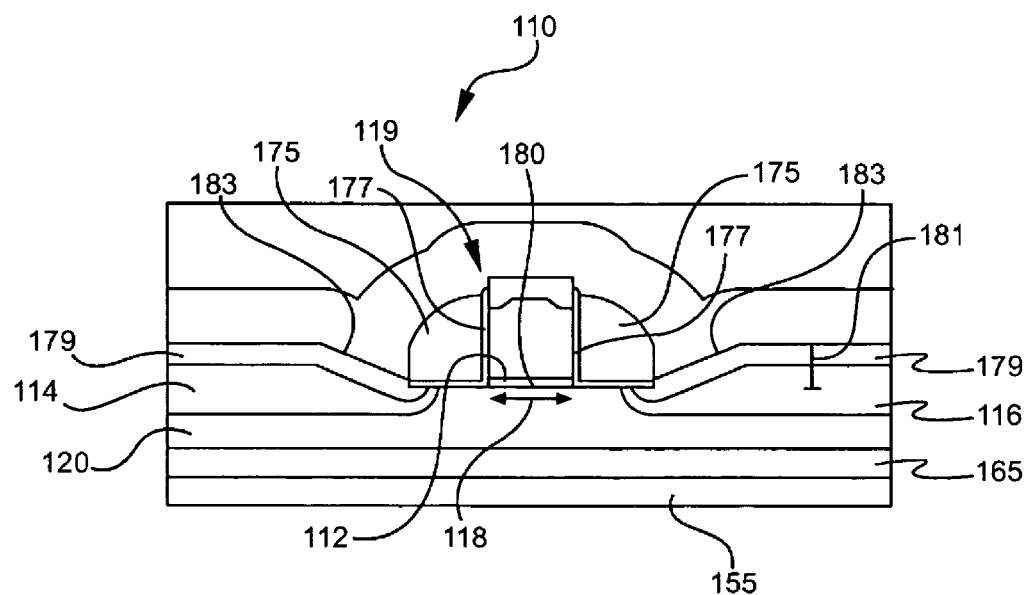
FIG. 2 is a cross-sectional view of the PMOS field effect transistor shown in FIG. 1 having additional layers formed on the device.

Referring now to FIG. 2, which shows a view of additional details of the NMOS device 110 of FIG. 1 after formation of spacers, layers over the source/drain regions, for example, silicide layers, and formation of the etch stop. It will be appreciated that the PMOS device may contain similar spacers and layers that may be tailored in dimensions and/or composition to affect the stress induced in the channel of the NMOS device as will be described further below. However, for illustration purposes, only NMOS device is shown and described in detail.

FIG. 2 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein.

Figure 5:
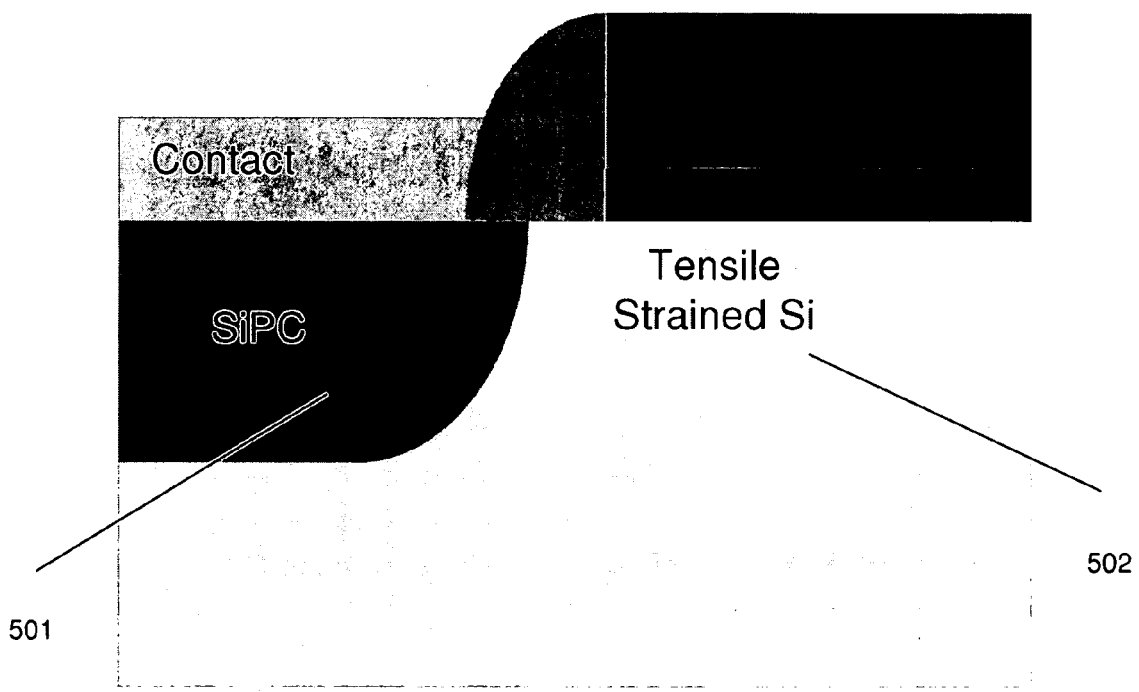
FIG. 5 is a cross-sectional view of a Si film having a tensile strained Si region in accordance with an embodiment of the present invention.

The epitaxial layer in accordance with an aspect of the present invention may also contain a very high concentration of above $5 \times 10^{20}$ atoms cm$^{-3}$ of phosphorus. Such a layer with a very high concentration of n-dopant phosphorus may also contain a low level of carbon or it may contain no carbon. FIG. 5 shows a cross-sectional view of a device which identifies the epitaxial layer 501 and the tensile strained region 502.

It was established earlier that while Csub in silicon as Si:C is attractive for creating tensile stress it has some disadvantages. Csub is not stable under excessive amounts of thermal stress as the Si:C film is grown under metastable conditions. For instance, most of the stress is lost after a 1050° C. thermal spike anneal. The problem is to retain the tensile stress in the channel after multiple anneals while keeping the series resistance as low as possible.

One way to achieve tensile stress in the channel in addition to low series resistance is to heavily dope the junctions with phosphorus. Due to its smaller size compared to silicon a P atom can act as a carbon atom does to induce tensile stress in the channel. The advantage of using phosphorus is that at the same time it creates stress it also keeps the series resistance low. Another advantage is the thermal stability of a SiP compared to Si:C or SiCP. Since there is no carbon present in SiP, this material is believed to be much more thermally stable under excessive thermal cycles.

In one embodiment, a substrate with an epitaxial layer containing a concentration of phosphorus of over $8 \times 10^{20}$ cm$^{-3}$ was created. Its concentration of phosphorus was measured at least 9 days after creating the layer and no measurable change had occurred. The phosphorus concentration in accordance with an aspect of the present invention is stable and the tensile stress created by the phosphorus is stable.

As is known by those skilled in the art, the doping of silicon with phosphorus has been limited by its solid solubility in silicon to below about $1 \times 10^{20}$ cm$^3$. Despite statements in the literature in excess of $1 \times 10^{20}$ cm$^3$, these statements are generally stated as goals, and it is believed that prior to the filing date of U.S. application Ser. No. 11/609,826, filed Dec. 12, 2006, methods of achieving dopant levels in excess of this value has not been described in the literature. U.S. application Ser. No. 11/609,826 describes one example in which a P doping level of $2 \times 10^{20}$ cm$^3$ was achieved, but this example utilized a relatively high pressure during the epitaxial deposition process.

Therefore, at the $1 \times 10^{20}$ cm$^{-3}$ level of doping, phosphorus is not able to provide sufficient stress to the channel. In accordance with one aspect of the present invention SiPC is epitaxially grown on a silicon substrate using a higher order silicon precursor as well as carbon and phosphorus sources. This method can dope the silicon with carbon as well as phosphorus to very high levels, and higher than the reported limited solid solubility level of phosphorus. Using an Applied Materials EPI Centura RP Reactor, films were grown with a phosphorus concentration as high as $1 \times 10^{21}$ cm$^{-3}$, as is shown in FIG. 3 with a secondary ion mass spectrometry (SIMS) graph. When this is compared to X-Ray Diffraction (XRD) data for substitutionality data, this phosphorus is shown to produce stress which is equivalent to stress caused by 0.3% substitutional carbon (FIG. 4). Phosphorus can be used to completely eliminate carbon from the SiPC epi, provided that high levels of phosphorus can be achieved. Epitaxial SiP can be created with very high phosphorus levels, which may optimize tensile stress as well as series resistance.

The SIMS profile of heavily phosphorus and carbon doped Si epitaxial film is shown on FIG. 3. The XRD spectra in FIG. 4 show the substitutional carbon to be approximately 0.85%. The total carbon concentration derived from the SIMS data of FIG. 3 is approximately 0.57%. This demonstrates that a concentration of $8.7 \times 10^{20}$ cm$^{-3}$ of P is able to induce stress equivalent to as much as approximately 0.3% carbon.

According to another embodiment of the present invention, Si films have been grown using P doping with a measured concentration up to $1.2 \times 10^{21}$ cm$^{-3}$ and no Csub, with a resistivity of 0.3 mOhm·cm, and which shows a tensile strain that is approximately equivalent to tensile strain caused by 0.55% Csub. FIG. 6 is a graph of XRD data from films with no carbon and all phosphorus, which shows ~700 arc second peak shift. This is equivalent to strain induced by 0.55% substitutional carbon. In another embodiment of the present invention, one may achieve a Si film by epitaxial process with Si and P sources and followed by annealing with a resistivity lower than 0.25 mOhm·cm. Currently, an achievable resistivity of 0.5 mOhm·cm in an epitaxial layer is considered to be very low. Accordingly, a resistivity of about 0.35 mOhm·cm, and more particularly, about 0.3 mOhm·cm and lower (for example, about 0.25 mOhm·cm) can be achieved.

As was stated earlier, the addition of carbon to the junction of an n-FET device improves performance of the device by inducing tensile strain in the channel. However, adding carbon may create process integration challenges for instance during the epitaxial growing process. In one embodiment, by lowering the required concentration of carbon and replacing it by doping with phosphorus one can drastically reduce these integration challenges. Also, the use of phosphorus will provide a much lower junction sheet resistance, which enhances the device performance. Higher sheet resistance and higher contact resistance after forming silicide are examples of integration challenges of silicon carbon epitaxy. According to embodiments of the present invention, a SiPC or a SiP layer is formed by the methods disclosed. Such a layer may be deposited in an area of the device that requires very low resistance. In one embodiment, a SiP layer can be deposited on top of a silicon carbon epitaxy layer as a capping layer. In another embodiment an epitaxial layer combining silicon, carbon and phosphorus can be created.

In accordance with another aspect of the present invention, one may apply an SiP or SiPC epitaxial layer as a capping layer on top of a silicon carbon layer formed on recessed source/drain areas. Such layers may also be directly formed on recessed source/drain areas.

In a further embodiment of the present invention, a device with a concentration of phosphorus greater than $7 \times 10^{20}$ cm$^{-3}$ is formed by using the following process parameters in an epitaxial growing process: a phosphine gas flow provided at a rate in the range of about 5-20 sccm (for example, about 10 sccm), a silicon precursor gas from a higher silane with a flow in the range of about 100 to 150 sccm (for example, about 135 sccm) and a hydrogen carrier gas with a flow rate in the range of about 2000 to about 5000 sccm (for example, about 4000 sccm) in a mix of gases with 100% mixing ratio.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for epitaxially forming a silicon film on a substrate surface, comprising:
   placing a substrate including a monocrystalline surface and secondary surfaces into a process chamber;
   exposing the substrate to a deposition gas comprising a mix of a higher order silicon source, a carrier gas and an n-type dopant source comprising a phosphorus source at a temperature of below about 600° C.; and
   creating on the monocrystalline surface an epitaxial silicon layer with a phosphorus concentration at a level equal to or greater than about $7 \times 10^{20}$ atoms cm$^{-3}$.

2. The method as claimed in claim 1, wherein the pressure in the process chamber is maintained at about 10 Torr.

3. The method of claim 1, wherein the phosphorus source comprises phosphine.

4. The method of claim 1, wherein the higher order silicon source is a higher order silane.

5. The method of claim 4, wherein the higher order silicon source is selected from trisilane, pentasilane and mixtures thereof.

6. The method of claim 1, wherein the level of phosphorus is at least about $8 \times 10^{20}$ atoms/cm$^3$.

7. The method of claim 1, wherein the level of phosphorus is about $1.2 \times 10^{21}$ atoms/cm$^3$.

8. The method of claim 1, wherein the temperature during deposition is in a range of about 540° C. and below about 560° C.

9. The method of claim 1, wherein the epitaxial silicon layer has a tensile stress created by n-dopants in the epitaxial silicon layer that is equivalent to the tensile stress that can be created by a concentration of substitutional carbon in the epitaxial silicon layer of about 0.55%.

10. The method of claim 1, wherein a measured resistivity in the epitaxial silicon layer is greater than about 0.25 mOhm·cm and lower than 0.5 mOhm·cm.

11. The method of claim 1, wherein the epitaxial film is formed during a fabrication step of a transistor manufacturing process, and the method further comprises:
   forming a gate dielectric on the substrate;
   forming a gate electrode on the gate dielectric; and
   forming source/drain regions on the substrate on opposite sides of the electrode and defining a channel region between the source/drain regions.

12. The method as claimed in claim 1, wherein the deposition gas mixture further comprises a carbon source.

13. The method as claimed in claim 1, wherein the deposition gas mixture lacks a carbon source.

* * * * *